(12) United States Patent
Ikugata et al.

(10) Patent No.: US 7,670,747 B2
(45) Date of Patent: Mar. 2, 2010

(54) PATTERN TRANSFER METHOD

(75) Inventors: Toshio Ikugata, Yokohama (JP); Akiko Miyakawa, Sagamihara (JP)

(73) Assignee: Nikon Corporation, Tokyo (JP)

( * ) Notice: Subject to any disclaimer, the term of this patent is extended or adjusted under 35 U.S.C. 154(b) by 593 days.

(21) Appl. No.: 11/580,955

(22) Filed: Oct. 16, 2006

(65) Prior Publication Data

US 2007/0029686 A1    Feb. 8, 2007

Related U.S. Application Data

(63) Continuation of application No. PCT/JP2005/007709, filed on Apr. 22, 2005.

(30) Foreign Application Priority Data

Apr. 28, 2004    (JP) .............................. 2004-133840

(51) Int. Cl.
*G03F 7/00* (2006.01)
*G03F 7/004* (2006.01)

(52) U.S. Cl. .................... 430/270.1; 430/311; 430/313; 430/317; 430/318; 264/496; 216/44

(58) Field of Classification Search .............. 430/270.1, 430/311, 313, 318, 317; 264/496; 216/44
See application file for complete search history.

(56) References Cited

U.S. PATENT DOCUMENTS 7,354,698 B2 *   4/2008   Van Santen et al. ......... 430/311
7,419,611 B2 *   9/2008   DiPietro et al. ............... 216/54
2008/0163769 A1 *   7/2008   Sewell ......................... 101/28
2008/0169268 A1 *   7/2008   DiPietro et al. ............... 216/43
2008/0174051 A1 *   7/2008   DiPietro et al. ............. 264/405
2008/0241418 A1 *  10/2008   Allen et al. .................. 427/559
2009/0041986 A1 *   2/2009   Zhang et al. ................ 428/156

FOREIGN PATENT DOCUMENTS

JP    A 2001-52979    2/2001
JP    A 2001-52994    2/2001
WO    WO 2004059386 A1 *    7/2004

OTHER PUBLICATIONS

A. Yokoo et al., "Nanoprint Technology and Organic Functional Photonic Crystal," NTT Basin Research Laboratories, pp. 171-179, Received Jul. 1, 2002.
H. Nakamura et al., "Imprint Lithography Using Triple-Layer-Resist and Its Application to Metal-Oxide-Silicon Field-Effect-Transisor Fabrication," Japanese Journal of Applied Physics, vol. 39, No. 12B, pp. 7080-7085, Dec. 2000.
Partial translation of A. Yokoo et al., "Nanoprint Technology and Organic Functional Photonic Crystal," NTT Basin Research Laboratories, pp. 171-179, Received Jul. 1, 2002.

* cited by examiner

*Primary Examiner*—Amanda C. Walke
(74) *Attorney, Agent, or Firm*—Oliff & Berridge, PLC

(57) ABSTRACT

A pattern transfer method includes first through third steps. In the first step, a desired pattern is transferred onto a resin layer formed on a substrate, a release layer being disposed between the substrate and the resin layer. In the second step, which is executed after the first step, the pattern having been transferred onto the resin layer is transferred to the substrate and the release layer is partially exposed. In the third step, which is executed after the second step, the release layer present between the substrate and the resin layer is dissolved and is thus removed from the substrate.

17 Claims, 6 Drawing Sheets

PATTERN TRANSFER METHOD

This application is a continuation of International Application No. PCT/JP 2005/007709 filed Apr. 22, 2005.

INCORPORATION BY REFERENCE

The disclosure of the following priority application is herein incorporated by reference: Japanese Patent Application No. 2004-133840 filed Apr. 28, 2004

BACKGROUND OF THE INVENTION

1. Field of the Invention

The present invention relates to a pattern transfer method.

2. Description of the Related Art

Nano-imprinting, a type of microprocessing technology that has been attracting a great deal of interest in recent years, is a technology whereby an indentation/projection (relief) pattern is transferred onto a substrate by using a mold having a fine relief pattern formed thereupon (see nonpatent reference literature: Spectroscopic Research vol 51, #4 (2002)). FIGS. 10A-10H illustrate a nano-imprinting method that may be adopted for pattern transfer. A substrate 110 having formed thereupon a resist film 120 is first prepared (see FIG. 10A).

Next, a mold 140 with a relief pattern formed thereupon is prepared and the surface of the mold 140 with the relief pattern is pressed against the resist film 120, thereby deforming the resist film 120 (see FIG. 10B). The mold 140 having been pressed against the resist film 120 is then separated from the resist film 120 (see FIG. 10C). The relief pattern at the mold is transferred onto the resist film 120 as a result.

Then, the residual resist 125 present over the area having been compressed by the mold 140 is removed through dry etching, thereby exposing the surface of the substrate 110 over the area (see FIG. 10D). Subsequently, a metal film 130 constituted of Ni or the like is vapor-deposited onto the substrate 110 (see FIG. 10E)). The resist film 120 is next removed by using an organic solvent (see FIG. 10F). Thus, only the metal film 130 having been directly deposited onto the substrate 110 remains on the substrate 110.

Using the remaining metal film 130 as a mask pattern, the surface of the substrate 110 is etched to a predetermined depth through an optimal etching method (see FIG. 10G). The metal film 130 is then removed from the etched substrate and, as a result, the substrate 110 with the relief pattern at the mold 140 transferred thereon is obtained (see FIG. 10H).

When transferring a pattern through nano-imprinting by using a resist as described above, the pattern cannot be sustained if it is transferred before pre-baking the resist. If the resist is to be pre-baked during the transfer, the mold needs to be formed by using a material that will withstand the baking process, which is bound to impose limitations on the choice of the material. Thermal deformation, which will prevent high-precision pattern transfer, is another problem that needs to be considered. Pattern transfer after the pre-baking process, on the other hand, is problematic in that the resist will have become hardened through the pre-baking process and thus the pattern cannot be transferred readily.

As an alternative to the resist, a resin may be used. The use of resin facilitates transfer of a curved pattern, e.g., a lens, which cannot be transferred with ease using a resist. However, it is difficult to reliably remove the resin following the etching process, leading to a problem of residual resin left on the substrate 110. The resin may be removed through, for instance, oxygen plasma ashing but it is still difficult to remove the resin reliably.

SUMMARY OF THE INVENTION

An object of the present invention, which has been completed by addressing the problems of the related art discussed above, is to provide a pattern transfer method that makes it possible to remove resin on the substrate with a high level of reliability.

The pattern transfer method according to the present invention comprises a first step in which a desired pattern is transferred onto a resin layer formed on a substrate, a release layer disposed between the substrate and the resin layer, a second step executed after the first step, in which the pattern having been transferred onto the resin layer is transferred to the substrate and the release layer is partially exposed and a third step executed after the second step, in which the release layer present between the substrate and the resin layer is dissolved and is thus removed from the substrate.

It is to be noted that the first step may include a step in which the release layer is formed on the substrate, a subsequent step in which the resin layer is formed on the release layer, a subsequent step in which a mold to be used to transfer the desired pattern is pressed against the resin layer and a subsequent step in which the mold and the resin layer are separated from each other.

It is desirable that the release layer is formed of $WO_3$, Al or $Al_2O_3$ and that the release layer is formed over a thickness of 10 nm to 1 μm.

It is also desirable that a largest interval between adjacent exposed portions of the release layer is set to fall within a range that is greater than 0 and equal to or less than 5 mm.

It is even more desirable that a largest interval between adjacent exposed portions of the release layer is set to fall within a range that is greater than 0 and equal to or less than 1 mm.

The pattern having been transferred onto the resin layer maybe transferred to the substrate through an etching process in the second step.

The resin layer may be a UV-curable resin, and the first step may include a step in which UV light is radiated to the resin layer when the mold is pressed against the resin layer.

By adopting the pattern transfer method according to the present invention, the resin having been formed on a substrate for purposes of pattern transfer can be removed with a high level of reliability.

DETAILED DESCRIPTION OF THE PREFERRED EMBODIMENT

The following is an explanation of an embodiment of the present invention given in reference to the drawings. FIGS. 1A-1F illustrate the pattern transfer method achieved in one embodiment of the present invention. It is to be noted that the pattern transfer method in the embodiment comprises first through third steps. The first step includes three steps shown in FIGS. 1A, 1B and 1C. Steps shown in FIGS. 1D and 1E respectively correspond to the second step and the third step.

A substrate 10 to which a pattern is to be transferred is constituted of quartz glass. It is to be noted that the present invention may be used with a substrate 10 having any shape. The surface of the substrate 10 has been ground so as to achieve a central average roughness Ra of 0.2 μm.

Figure 1A:
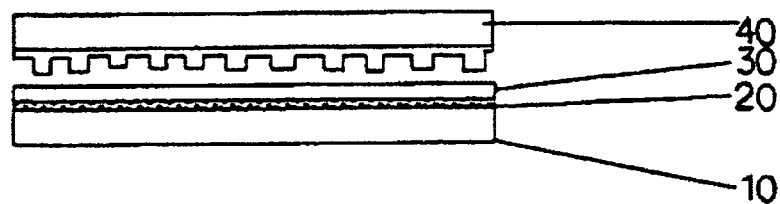
FIG. 1 illustrates the pattern transfer method achieved in an embodiment of the present invention.

In the step shown in FIG. 1A, a resin layer 30, which is the transfer target, is formed onto the surface of the substrate 10 via a release layer 20. First, a $WO_3$ film to constitute the release layer 20 is vacuum-deposited over a film thickness of 0.3 μm onto the substrate 10. It is to be noted that Al, $Al_2O_3$ or the like instead of $WO_3$ may be used to constitute the release layer 20. It is desirable that the film thickness of the release layer 20, formed to assure reliable removal of the resin layer 30 to be detailed later, be within a range of 10 nm to 1 μm. If the film thickness of the release layer 20 is too small, the resin layer 30 cannot easily be separated. If, on the other hand, the release layer 20 is too thick, etching will become a very time-consuming process.

Then, the resin layer 30 is formed on the release layer 20. The resin layer 30 maybe formed by using a thermosetting resin, a thermoplastic resin or a UV-curable resin. The use of a UV-curable resin will achieve a superior throughput over the throughput achieved by using a thermosetting resin or a thermoplastic resin and also prevents a dimensional change resulting from thermal deformation. A mold 40 is formed by using, for instance, heat resisting glass with a heat resisting property and a sufficient level of mechanical strength. A relief pattern to be transferred onto the substrate 10 is formed at the surface of the mold 40.

Figure 1B:
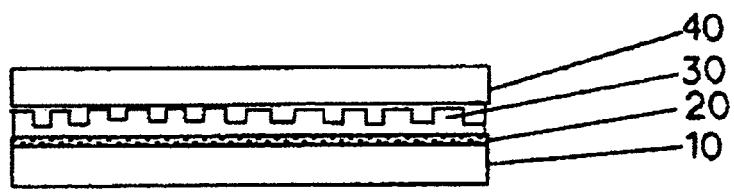

In the step shown in FIG. 1B, the mold 40 is pressed against the resin layer 30. If the resin layer 30 is constituted of a UV-curable resin, UV light is radiated through the rear surface of the substrate 10 as the mold 40 is pressed. It is to be noted that if the mold 40 is constituted of a UV light-transmitting material, the UV light may be radiated from the side where the mold 40 is present. In such a case, the substrate 10 may be constituted of a nontransparent material instead of glass.

Figure 1C:
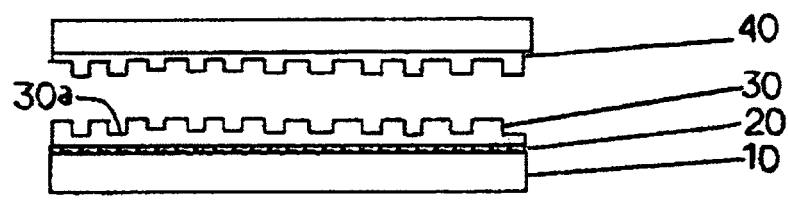

When the pattern at the mold 40 is fully transferred onto the resin layer 30, the mold 40 is separated from the resin layer 30, as shown in FIG. 1C. The relief pattern at the mold 40 is thus transferred onto the resin layer 30. The compressed resin 30a in FIG. 1C is the resin layer 30 present in the areas having been compressed by the projected portions at the mold 40.

Figure 1D:

Through the step shown in FIG. 1D, the compressed resin 30a and the portions of the surface of the substrate 10 underneath the compressed resin 30a are removed through a dry etching process executed by using an $SF_6$ gas. During this process, the substrate 10 is etched to a specific depth so as to transfer the relief pattern at the mold 40 onto the substrate 10.

Figure 1E:
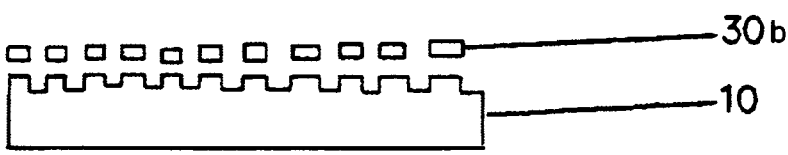

Subsequently, the release layer 20 is soaked in an alkaline solution (10% NaOH aqueous solution) for five minutes as shown in FIG. 1E. Since the portions of the release layer 20 present under the resin layer 30b have become exposed at the sides thereof through etching, the release layer 20 is dissolved starting at the exposed portions and, as a result, the resin layer 30b having remained on the substrate 10 becomes released from the substrate 10.

Figure 1F:
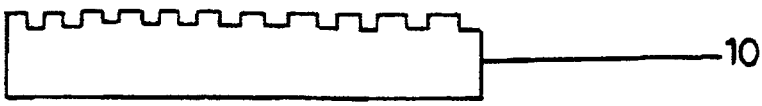

The release layer 20 is dissolved without damaging the substrate 10, allowing the substrate 10 to sustain exactly the same surface roughness level as that prior to the process. It is to be noted that the release layer 20 may be dissolved by spraying an alkaline solution onto the release layer 20 through spin washing instead of by soaking the release layer 20 in an alkaline solution. Through the steps shown in FIG. 1A through FIG. 1E described above, the substrate 10 having the relief pattern at the mold 40 transferred thereto, as shown in FIG. 1F is obtained.

Various relief patterns can be transferred onto the substrate 10 through the transfer method described above. Several examples of such patterns are now explained in reference to FIGS. 2 through 9.

(First Example)

Figure 2:
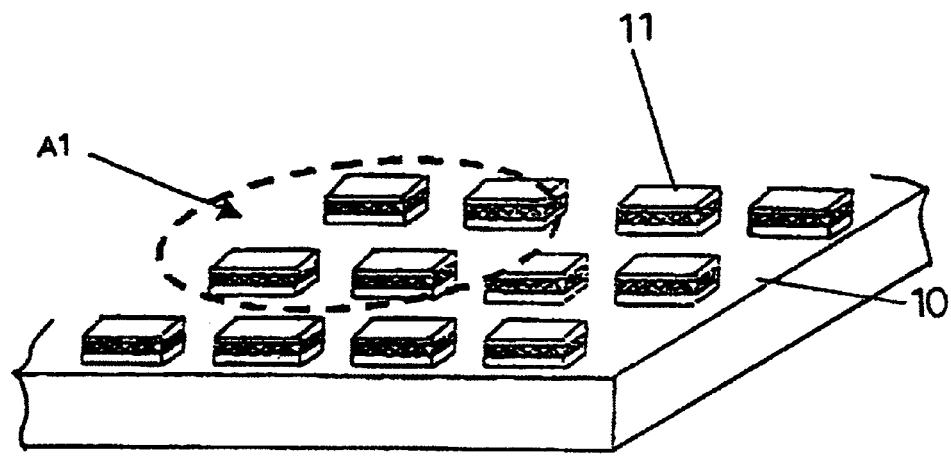
FIG. 2 is a perspective presenting a first example of a relief pattern that may have been transferred onto the substrate.
Figure 3:
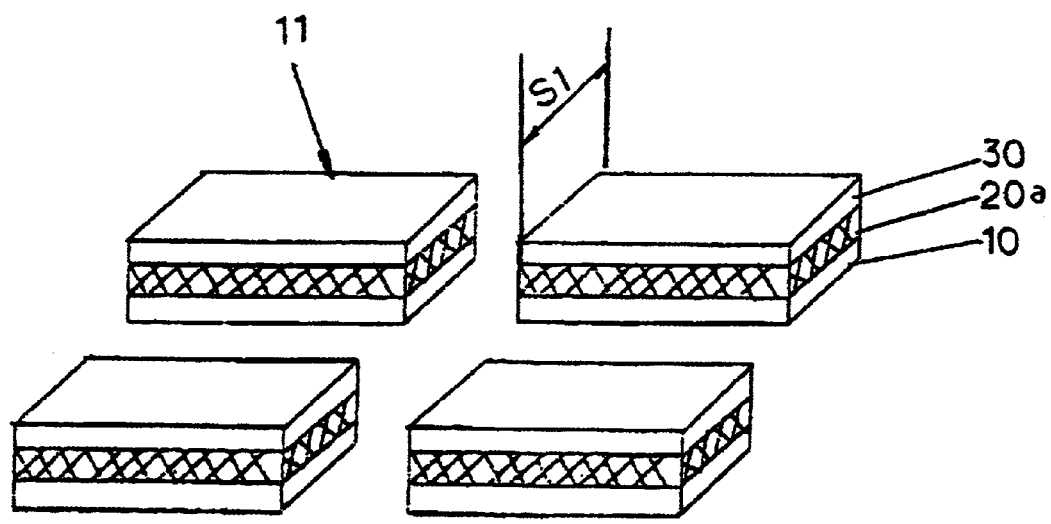
FIG. 3 is an enlargement of A1 in FIG. 2.

FIGS. 2 and 3 present a first example of the relief pattern, with FIG. 2 presenting a perspective of the substrate 10 and FIG. 3 presenting an enlargement of A1 in FIG. 2. It is to be noted that FIGS. 2 and 3 both show the substrate 10 having undergone the step in FIG. 1D, i.e., after its surface is etched.

Through the dry etching process, a plurality of rectangular parallelepiped projections 11 set with regularity have been transferred onto the substrate 10. The release layer 20 has been divided into separate release portions 20a through dry etching and each projection 11 includes such a release portion 20a formed therein. The sides of the release portion 20a are exposed to the outside. When the projections 11 assume the shape shown in FIG. 3 and are set in the pattern shown in FIG. 3, it is desirable to set the length S1 of each projection 11 measured along its shorter side equal to or less than 5 mm in order to ensure that the release portions 20a are dissolved with a higher level of reliability with the alkaline solution. It is even more desirable to set the length S1 equal to or less than 1 mm.

Since the release portions 20a start dissolving at their exposed sides, the length of time required for the release portions 20a to become fully dissolved is equal to the length of time required to dissolve release portions 20a having a width equal to the length S1 measured along the shorter side. Namely, the length S1 matches the interval between the exposed sides of the release portions 20a measured along the shorter side, and the smaller this interval is, the more readily the dissolving solution is allowed to enter the release portions 20a at the projected portions 11, sandwiched between the resin layer 30 and the substrate 10. It is to be noted that the specific numerical values applicable to the interval, at which the release portions 20a can be reliably dissolved, have been determined by the inventor of the present invention and the like through testing.

(Second Example)

Figure 4:
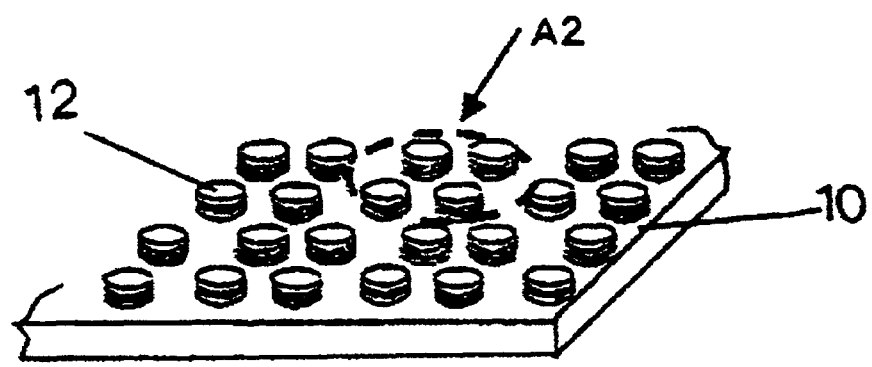
FIG. 4 is a perspective presenting a second example of a relief pattern that may have been transferred onto the substrate.
Figure 5:
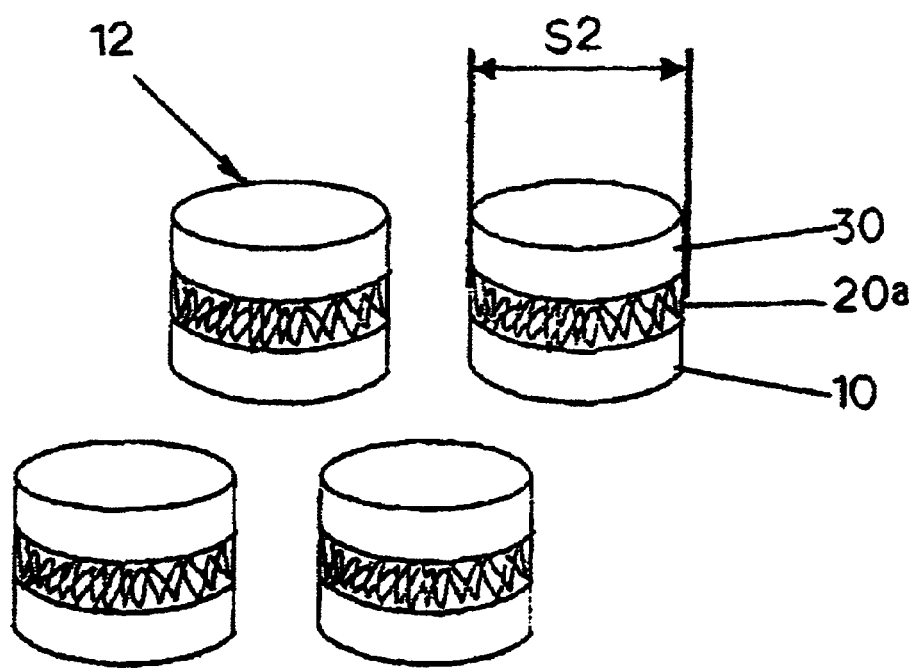
FIG. 5 is an enlargement of A2 in FIG. 4.

FIG. 4 is a perspective of a second example of the relief pattern, and FIG. 5 is an enlargement of A2 in FIG. 4. FIG. 4 and FIG. 5, too, show the substrate 10 having undergone the step in FIG. 1D, i.e., after its surface is etched. Through the dry etching process, a plurality of cylindrical projections 12 have been formed on the substrate 10. The projections 12, too, each include a release portion 20a sandwiched between the resin layer 30 and the substrate 10, with the side surface of the release portion 20a exposed to the outside.

As shown in FIG. 5, it is desirable to set the diameter S2 of each projection 12 equal to or less than 5 mm in order to ensure that the release portion 20a is dissolved with a high level of reliability. It is even more desirable to set the diameter S2 equal to or less than 1 mm. These numerical values have also been determined by the inventor of the present invention and the like through testing.

(Third Example)

Figure 6:
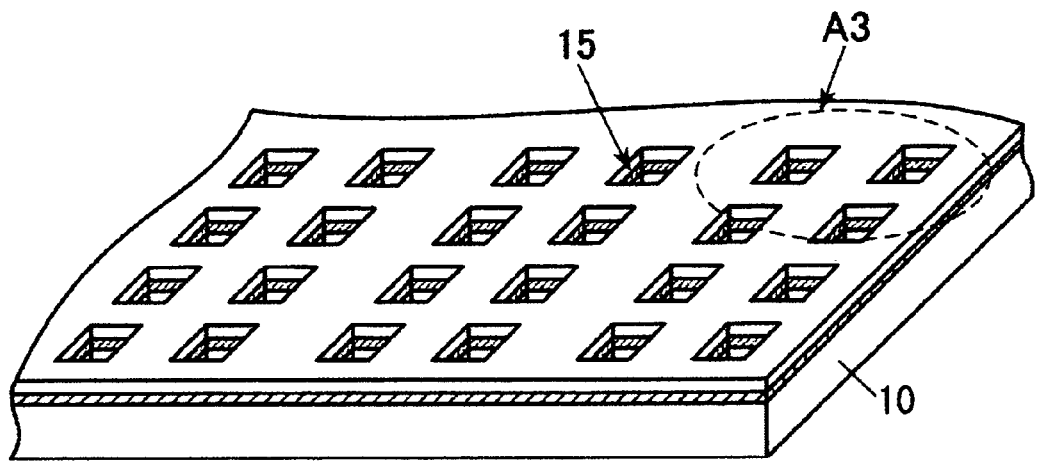
FIG. 6 is a perspective presenting a third example of a relief pattern that may have been transferred onto the substrate.
Figure 7:
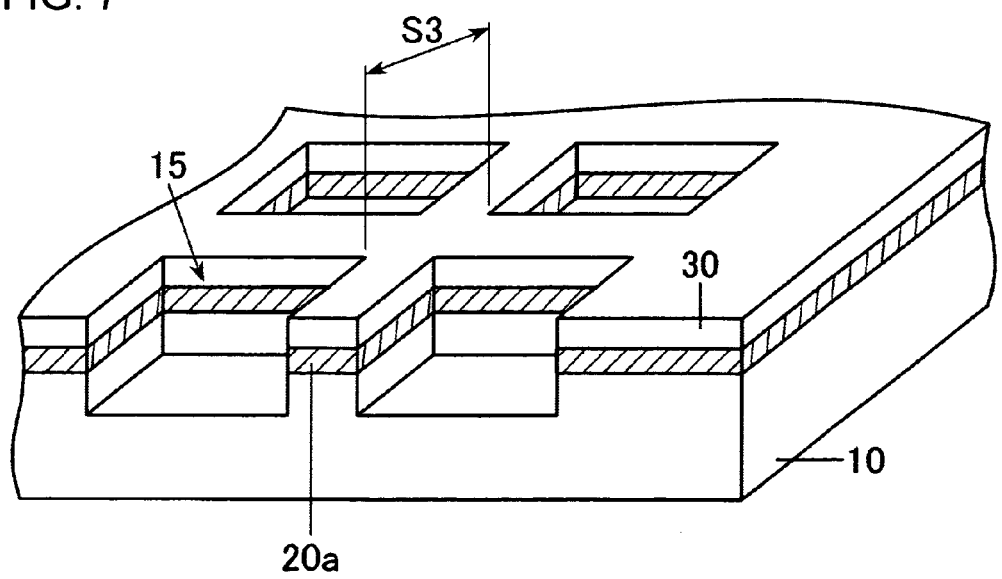
FIG. 7 is an enlargement of A3 in FIG. 6.

FIG. 6 is a perspective of a third example of the relief pattern, and FIG. 7 is an enlargement of A3 in FIG. 6. It is to be noted that FIG. 7 also provides a sectional view of indented portions 15. In addition, FIGS. 6 and 7 both show the substrate 10 having undergone the step in FIG. 1D, i.e., after its surface is etched. A plurality of rectangular indentations 15 have been formed in a lattice pattern on the substrate 10. A release portion 20a having been formed by etching the release layer 20 is partially exposed inside each indentation 15.

The resin layer 30 can be released from the substrate 10 by dissolving the release portion 20a sandwiched between the resin layer 30 and the substrate 10 with an alkaline solution. The greatest distance S3 among a plurality of intervals between adjacent indentations 15 represents the interval between exposed portions present along the direction in which the length of time required to dissolve the release portion 20a is determined. It is desirable to ensure that the distance S3 does not exceed 5 mm in order to ensure that the release portion 20a is dissolved with the alkaline solution with a higher level of reliability. It is even more desirable to set the distance S3 equal to or less than 1 mm. These numerical values, too, have been determined by the inventor of the present invention and the like through testing.

(Fourth Example)

Figure 8:
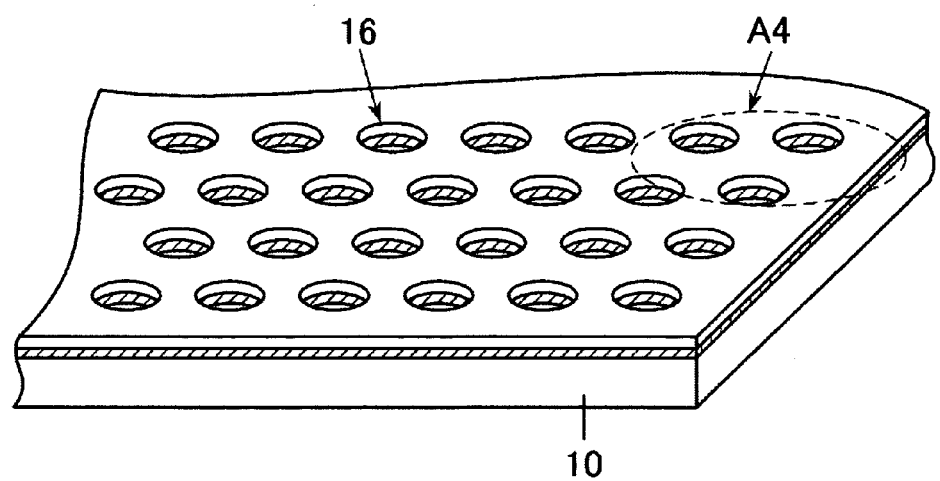
FIG. 8 is a perspective presenting a fourth example of a relief pattern that may have been transferred onto the substrate.
Figure 9:
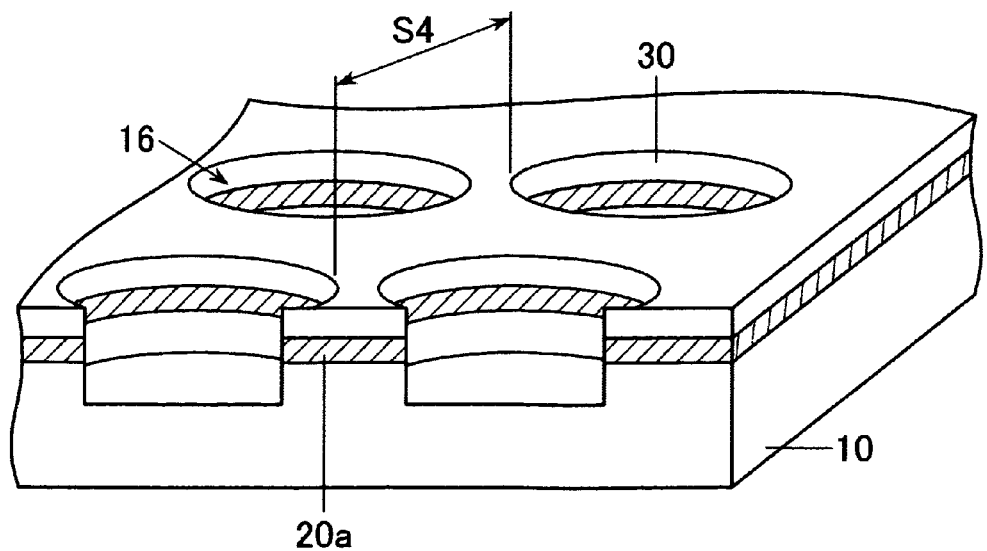
FIG. 9 is an enlargement of A4 in FIG. 8.
Figure 10A:
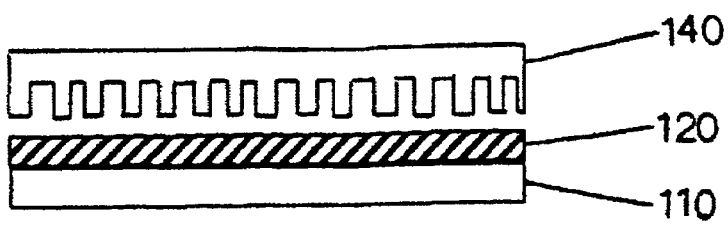
FIG. 10 illustrates a pattern transfer method adopting a nano-imprinting technology.
Figure 10B:
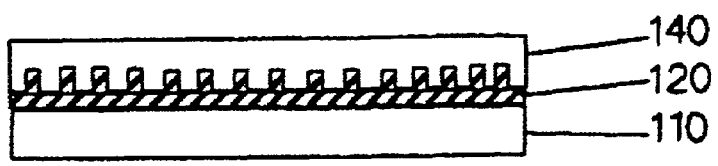
Figure 10C:
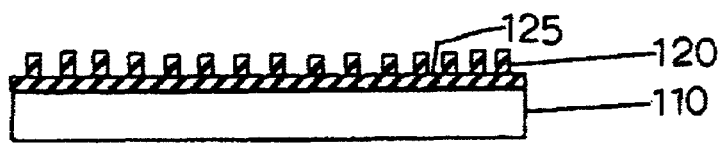
Figure 10D:
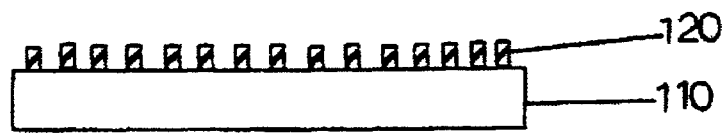
Figure 10E:
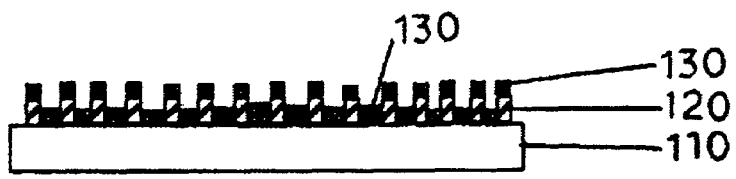
Figure 10F:
Figure 10G:
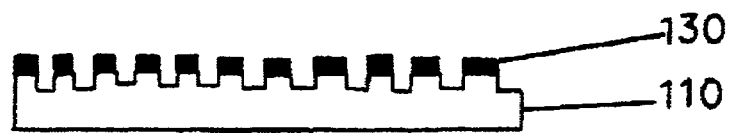
Figure 10H:
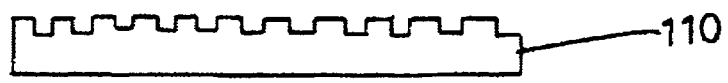

FIG. 8 is a perspective of a fourth example of the relief pattern, and FIG. 9 is an enlargement of A4 in FIG. 8. It is to be noted that FIG. 9 also provides a sectional view of indented portions 16. FIGS. 8 and 9 both also show the substrate 10 having undergone the step in FIG. 1D, i.e., after its surface is etched.

A plurality of indentations 16 with a circular transverse section have been formed with regularity both along the longitudinal direction and the lateral direction on the substrate 10. A release portion 20a having been formed by etching the release layer 20 is partially exposed inside each indentation 16 at its side. It is desirable to ensure that the greatest distance S4 among the intervals between the adjacent indentations 16 does not exceed 5 mm in order to dissolve the release portion 20a with a higher level of reliability with the alkaline solution. It is even more desirable to set the distance S4 equal to or less than 1 mm. These numerical values, too, have been determined by the inventor of the present invention and the like through testing.

As described above, the release layer 20 can be dissolved with a higher level of reliability by using an alkaline solution after the etching process and thus, the resin layer 30 can be reliably removed from the substrate 10 in the embodiment. It is to be noted that the resin layer 30 constituted of resin with a low level of viscosity can be deformed by pressing the mold 40 against it with less force, which allows the apparatus to assume a simpler structure and thus reduces the manufacturing cost. In addition, unlike the ashing method, the method according to the invention does not leave any residual carbide after the resin removal and, for this reason, the present invention is ideal in pattern transfer on a substrate with a large area to be used for display purposes and the like.

Furthermore, since the only significant facility requirement is a release layer dissolving tank large enough to accommodate the substrate 10, the cost of the facilities can be reduced. In addition, while the pattern is formed by using the mold 40 and executing dry etching in the embodiment described above, the pattern may instead be formed through the machining (processing executed by using, for instance, a dicing saw).

It is obvious that the pattern transfer method according to the present invention may be adopted when transferring patterns other than those shown in the figures. The pattern transfer method explained above may be used in conjunction with the following manufacturing technologies. For instance, it may be adopted when manufacturing an insulating substrate to be used to insulate electrical field discharge portions from one another in a field emission display device. The pattern transfer method according to the present invention may be adopted to manufacture an insulating substrate by, for instance, forming through holes with a pitch equal to the pitch of the electrical field discharge portions. The insulating substrate thus obtained is set so as to align the electrical field discharge portions with the through holes. The pattern transfer method according to the present invention may also be adopted when manufacturing an optical element and, more specifically a diffractive optical element. For instance, diffractive optical elements may be manufactured by setting a specific pitch relative to the operating wavelength, forming cyclical structures at a resin layer and transferring the cyclical structures onto a substrate at which the optical element is to be formed.

As described above, the pattern transfer method according to the present invention is effective in applications in which superfine structures need to be formed in a substrate.

While the invention has been particularly shown and described with respect to a preferred embodiment and variations thereof, the present invention is not limited to these examples and it will be understood by those skilled in the art that various changes in form and detail may be made therein without departing from the spirit, scope and teaching of the invention.

What is claimed is:

1. A pattern transfer method comprising:
a first step in which a desired pattern is transferred onto a resin layer formed on a substrate, a release layer being disposed between the substrate and the resin layer;
a second step executed after the first step, in which the pattern having been transferred onto the resin layer is transferred to the substrate and the release layer is partially exposed; and
a third step in which the resin layer that remains after the second step is removed from the substrate by dissolving the partially exposed release layer present between the substrate and the resin layer.

2. A pattern transfer method according to claim 1, wherein:
the first step includes:
a step in which the release layer is formed on the substrate;
a subsequent step in which the resin layer is formed on the release layer;
a subsequent step in which a mold to be used to transfer the desired pattern is pressed against the resin layer; and
a subsequent step in which the mold and the resin layer are separated from each other.

3. A pattern transfer method according to claim 1, wherein:
the release layer is formed of $WO_3$, Al or $Al_2O_3$.

4. A pattern transfer method according to claim 2, wherein:
the release layer is formed of $WO_3$, Al or $Al_2O_3$.

5. A pattern transfer method according to claim 1, wherein:
the release layer has a thickness of 10 nm to 1 μm.

6. A pattern transfer method according to claim 2, wherein:
the release layer has a thickness of 10 nm to 1 μm.

7. A pattern transfer method according claim 1, wherein:
a largest interval between adjacent exposed portions of the release layer is set to fall within a range that is greater than 0 and equal to or less than 5 mm.

8. A pattern transfer method according claim 2, wherein:
a largest interval between adjacent exposed portions of the release layer is set to fall within a range that is greater than 0 and equal to or less than 5 mm.

9. A pattern transfer method according to claim 1, wherein:
a largest interval between adjacent exposed portions of the release layer is set to fall within a range that is greater than 0 and equal to or less than 1 mm.

10. A pattern transfer method according to claim 2, wherein:
a largest interval between adjacent exposed portions of the release layer is set to fall within a range that is greater than 0 and equal to or less than 1 mm.

11. A pattern transfer method according to claim 1, wherein:
the pattern having been transferred onto the resin layer is transferred to the substrate through an etching process in the second step.

12. A pattern transfer method according to claim 2, wherein:
the resin layer is a UV-curable resin, and
the first step includes a step in which UV light is radiated to the resin layer when the mold is pressed against the resin layer.

13. A pattern transfer method according to claim 1, wherein:
the release layer comprises $WO_3$.

14. A pattern transfer method according to claim 1, wherein:
the release layer comprises $Al_2O_3$.

15. A pattern transfer method according to claim 2, wherein:
the release layer comprises $WO_3$.

16. A pattern transfer method according to claim 2, wherein:
the release layer comprises $Al_2O_3$.

17. A pattern transfer method according to claim 1, wherein:
the partially exposed release layer is dissolved with an alkaline solution.

* * * * *